United States Patent [19]

Booth et al.

[11] Patent Number: 5,543,585
[45] Date of Patent: Aug. 6, 1996

[54] DIRECT CHIP ATTACHMENT (DCA) WITH ELECTRICALLY CONDUCTIVE ADHESIVES

[75] Inventors: Richard B. Booth, Williamson County, Tex.; Michael A. Gaynes; Robert M. Murco, both of Broome County, N.Y.; Viswanadham Puligandla, Travis County, Tex.; Judith M. Roldan; Ravi Saraf, both of Westchester County, N.Y.; Jerzy M. Zalesinski, Crittenden County, Vt.

[73] Assignee: International Business Machines Corporation, Armonk, N.Y.

[21] Appl. No.: 190,507

[22] Filed: Feb. 2, 1994

[51] Int. Cl.$^6$ ................................... H05K 1/18
[52] U.S. Cl. ................. 174/261; 174/260; 361/768; 361/770; 361/767
[58] Field of Search ................... 174/260, 261; 361/768, 760, 767, 770, 777

[56] References Cited

U.S. PATENT DOCUMENTS

| | | | |
|---|---|---|---|
| 4,012,832 | 3/1977 | Crane | 29/575 |
| 4,050,756 | 9/1977 | Moore | 339/59 |
| 4,067,104 | 1/1978 | Tracy | 29/626 |
| 4,113,981 | 9/1978 | Fujita et al. | 174/88 R |
| 4,157,932 | 6/1979 | Hirata | 156/310 |
| 4,423,435 | 12/1983 | Test, III | 357/65 |
| 4,437,109 | 3/1984 | Anthony et al. | 357/68 |
| 4,603,374 | 7/1986 | Wasielewski | 361/389 |
| 4,661,192 | 4/1987 | McShane | 156/292 |
| 4,667,401 | 5/1987 | Clements et al. | 29/832 |
| 4,694,572 | 9/1987 | Leber et al. | 29/840 |
| 4,720,740 | 1/1988 | Clements et al. | 357/72 |
| 4,779,338 | 10/1988 | Kohara et al. | 29/832 |
| 4,811,081 | 3/1989 | Lyden | 357/80 |
| 4,889,980 | 12/1989 | Hara et al. | 235/488 |
| 4,914,057 | 4/1990 | Gloton | 437/193 |
| 4,984,358 | 1/1991 | Nelson | 29/830 |
| 5,001,302 | 3/1991 | Atsumi | 174/94 R |
| 5,038,251 | 8/1991 | Sugiyama et al. | 361/398 |
| 5,061,657 | 10/1991 | Queen et al. | 437/219 |
| 5,068,714 | 11/1991 | Seipler | 357/80 |
| 5,072,874 | 12/1991 | Bertram et al. | 228/264 |
| 5,074,947 | 12/1991 | Estes et al. | 156/307.3 |
| 5,086,558 | 2/1992 | Grube et al. | 29/832 |
| 5,120,678 | 6/1992 | Moore et al. | 437/183 |
| 5,147,084 | 9/1992 | Behun et al. | 228/56.3 |
| 5,192,835 | 3/1993 | Bull et al. | 174/260 |
| 5,255,431 | 10/1993 | Burdick | 29/840 |
| 5,436,412 | 6/1995 | Ahmad et al. | 174/265 |

FOREIGN PATENT DOCUMENTS 4113643A 4/1992 Japan .

OTHER PUBLICATIONS

R. R. Bechard et al.; "Chip Salvage Head: Removes Good Chips From Bad Modules For Reuse"; IBM Tech. Disclosure Bulletin, vol. 26 No. 10A, Mar. 1984.

T. R. Anthony; "Forming Electrical Interconnections Through Semiconductor Wafers"; J. Appl. Phys. 52(8), Aug. 1981; pp. 5340–5349.

*Primary Examiner*—Laura Thomas
*Attorney, Agent, or Firm*—Whitham, Curtis, Whitham & McGinn; Michael E. Belk

[57] ABSTRACT

A simple process for card assembly by Direct Chip Attachment (DCA) uses electrically conductive adhesives. Two methods create the same intermediate wafer product with a layer of insulative thermoplastic and conductive thermoplastic bumps. After sawing or dicing the wafer to form the chips, the chips are adhered to chip carriers with conductive pads which match the conductive thermoplastic bumps, using heat and pressure. Chips may be easily removed and replaced using heat.

21 Claims, 8 Drawing Sheets

DIRECT CHIP ATTACHMENT (DCA) WITH ELECTRICALLY CONDUCTIVE ADHESIVES

BACKGROUND OF THE INVENTION

1. Field of the Invention

The present invention generally relates to the manufacture of electronic circuits and, more particularly, to a module structure and a simple process for card assembly by Direct Chip Attachment (DCA), using electrically conductive adhesives, which are reworkable.

2. Background

An involved card assembly attach process exists for Direct Chip Attachment (DCA). Unique decals are fabricated with a plated solder pattern corresponding to the chip pad footprint. These decals are accurately positioned onto the intended footprint of the chip carrier and the solder is subsequently transferred to the carrier sites in a reflow oven. The soldered pads are then leveled mechanically for coplanarity and finally the chips are placed and reflowed.

Solder alloys are used pervasively to interconnect components to carriers. Undesirable attributes of solder alloys include high temperature joining, cleaning/residues, fatigue life and the environmental ramification of lead (Pb).

Moore et al., U.S. Pat. No. 5,120,678, disclose a method for assembling an integrated circuit component to a substrate by a solder by interconnection that is reinforced by a polymer film. While this method encapsulates ball grid arrays with a thermoset adhesive, the thermoset is not reworkable.

An alternative to solder DCA is electrically conductive adhesive joining. Screen printing 0.004" features on 0.008" centers is possible with some electrically conductive adhesives.

U.S. Pat. No. 5,074,947 to Estes and 5,086,558 to Grube, disclose attaching flip chips to substrates using conductive polymer materials. All the above cited patents are incorporated herein by reference.

SUMMARY OF THE INVENTION

It is therefore an object of the present invention to provide a process to attach a flip-chip to a substrate using a thermoplastic, is,tropically conducting adhesive.

According to a preferred embodiment of the invention, there is provided a two pass screen process in which a thermoplastic adhesive is applied to the pad side of the wafer. This two pass process can be accomplished in either of two methods where, in one pass, an electrically conductive thermoplastic adhesive is applied to the chip bond pads. A second pass applies an electrically insulating thermoplastic adhesive to the non-conductive area of the same wafer surface. The methods differ primarily by the order of the passes.

In a second preferred embodiment of this invention, individual chips are heated to a temperature at which the thermoplastic adhesive is in a tacky state, in preparation for bonding to a substrate. Placement and bonding is accomplished in one step. The electrical pads on the chip and substrate are interconnected with the electrically conductive adhesive.

It is further an object of the present invention to provide a method of preparing a wafer for DCA bonding with electrically conductive adhesives using current art in adhesive application.

The assembly process is a one step process which accomplishes placement, joining and encapsulation and which is reworkable. The process eliminates the need for many of the commonly required steps to prepare chip sites on the substrate for DCA. The process also eliminates the need for solder reflows, two flux application, post attach cleaning, application and cure of thermoset encapsulant.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
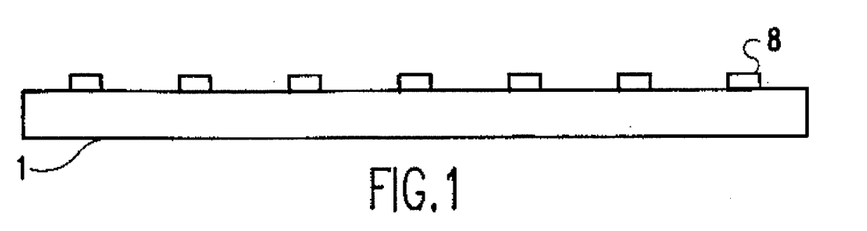
FIGS. 1 through 3 show cross-sectional views of a substrate in the process of adding insulative and conducting thermoplastic to the substrate, according to the first method of the invention.
Figure 2:
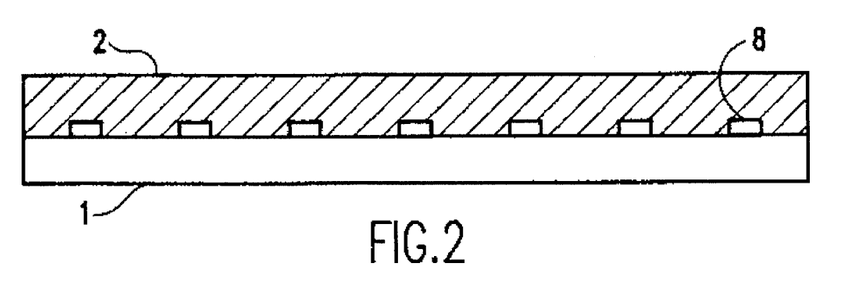
Figure 3:
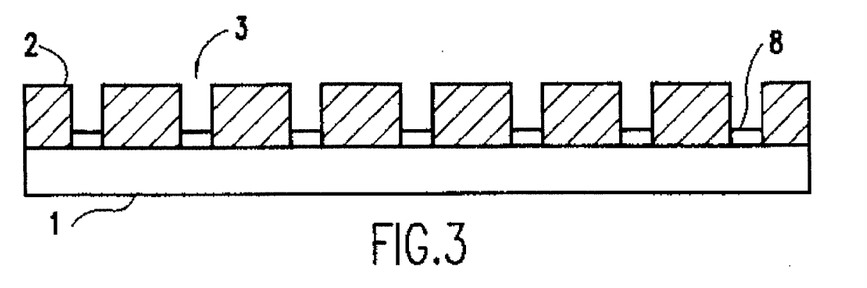

Referring now to the drawings, and more particularly to FIG. 1, there is shown a substrate 1. The substrate may be a wafer or chip with integrated circuits or a substrate (ceramic, organic, or flexible) to which an integrated circuit chip is to be attached, such as a chip carrier module or a circuit board/card. In a specific embodiment, a wafer, prior to the practice of the first method according to the invention, has a plurality of chip sites at which integrated circuits have been formed. Each chip site includes a matrix of thin conductive metal contacts 8. After the processing according to the invention, the wafer is sawn or diced into the individual chips. In FIG. 2, an insulative thermoplastic adhesive 2 is added to the surface of substrate 1 where the contact pads 8 are located. After baking or heating the insulative adhesive 2, holes 3 are made in the adhesive layer 4, as shown in FIG. 3. The holes 3 may be made in the insulative adhesive layer 2 at each metallic pad by various methods including:

1. spin coating onto the substrate 1, drying, and then, using laser ablation of the adhesive material in pad areas 8 to make the holes 3, 2. bonding a dry insulative adhesive film which is prepunched with holes 3 directly to the substrate 1 (a stiff backing may be required during punching), or 3. screen printing to place insulative adhesive everywhere on the substrate surface except chip bond pads 8 and then drying.

The holes 3 are then filled with conductive thermoplastic adhesive and baked or heated at an elevated temperature such as 80°–150° C. and preferably at about 120° C. to dry the conductive adhesive.

Figure 4:
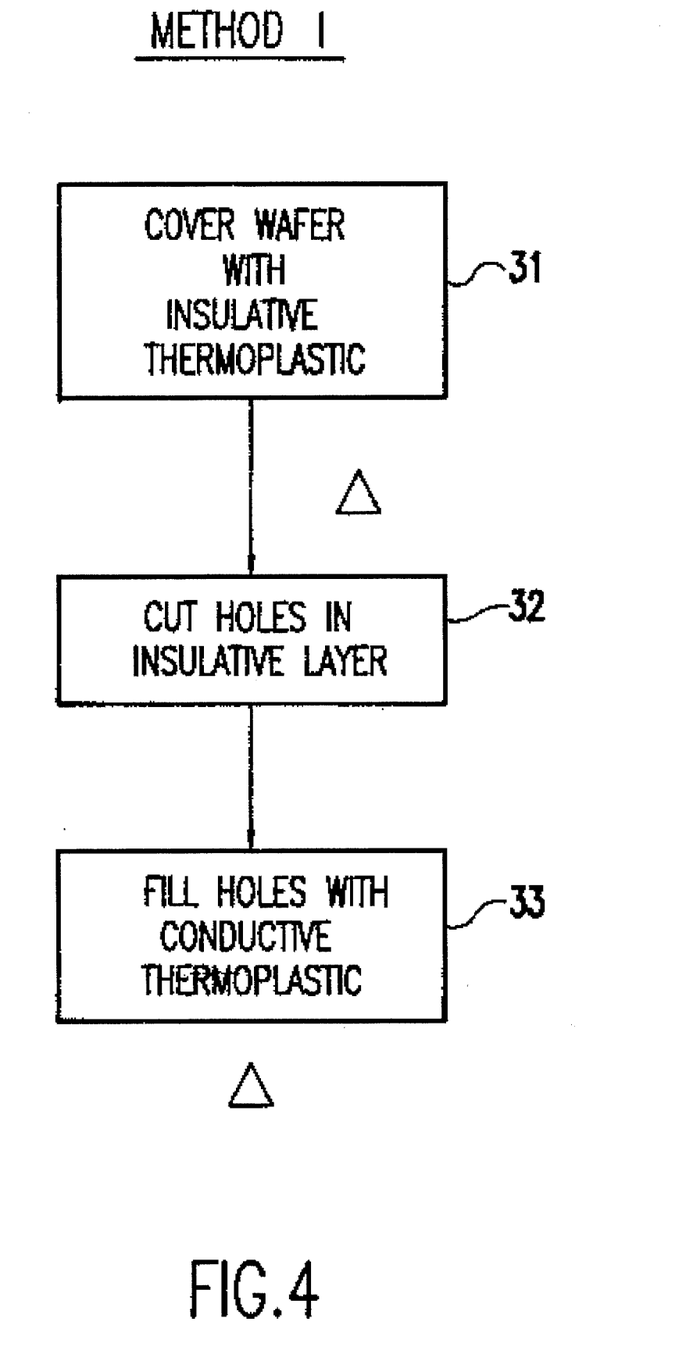
FIG. 4 is a flow diagram showing the process steps of the first method.

FIG. 4 shows a flow diagram of the first method. The first step 31 is to coat the substrate with the insulative adhesive, and after curing, holes are cut in the insulative layer in step 32. Finally, the holes are filled with a conductive adhesive in step 33, and the conductive adhesive is dried.

Figure 5:
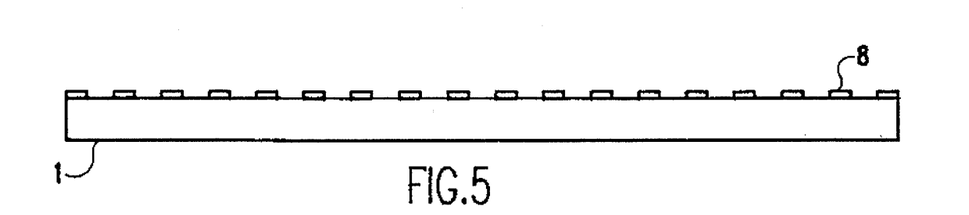
FIGS. 5 through 7 show cross-sectional views of a substrate in the process of adding insulative and conducting thermoplastic to the substrate, according to the second method of the invention.
Figure 6:
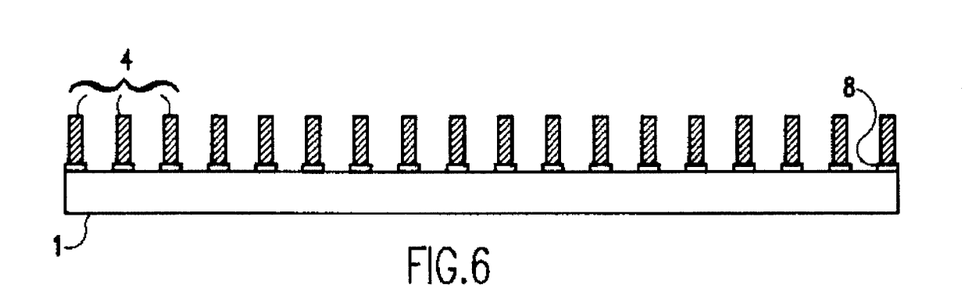
Figure 7:
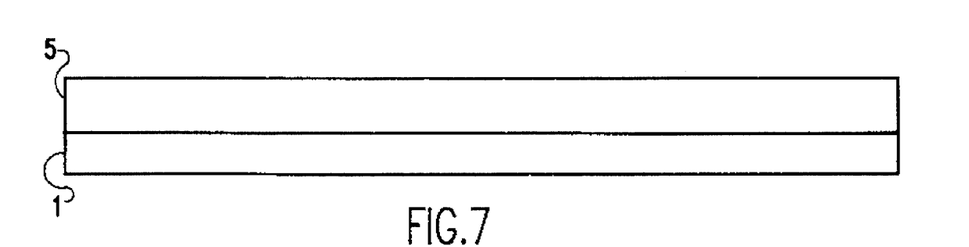

FIGS. 5 through 7 illustrate the second method according to the invention. FIG. 5 shows a cross-sectional view of the substrate 1 with conductive metal pads 8, prior to processing. In FIG. 6, conductive adhesive bumps or pegs 4 are added to the substrate 1. Preferably, the bumps are applied by mask screening. The conductive thermoplastic may also be added to a matrix of conductive metal pads 8 on another substrate to which the first substrate is to be attached to assist in bonding. The conductive thermoplastic is then dried. Insulative adhesive 2 (FIG. 9) is applied to the wafer between conductive adhesive 4 bumps or pegs to create the composite structure 5 which covers the entire surface of the substrate, as shown in FIG. 7. Prior to adding insulative adhesive paste, the conductive bumps may be plated (electroless, electroplate, or evaporation) with a very thin layer of low melting temperature metal such as Ag to prevent interaction with the insulative adhesive (e.g. dissolving the pegs). This product is baked to dry the insulative thermoplastic.

Prior to applying the insulating adhesive, there may be a layer of solder resist (procoat) on the substrate such as PSR-4000 or VACREL. Also, there may be a passivation layer on the chip such as polyimide or nitride. The insulative adhesive must be compatible with these chip and carrier surfaces in order to reliably bond the chip to the carrier substrate with the single layer of adhesive.

In this second method, the insulative adhesive may be applied by bonding a prepunched film, screen printing, or spreading a flowable paste or emulsion (e.g. spin coating) directly onto the substrate surface.

Figure 8:
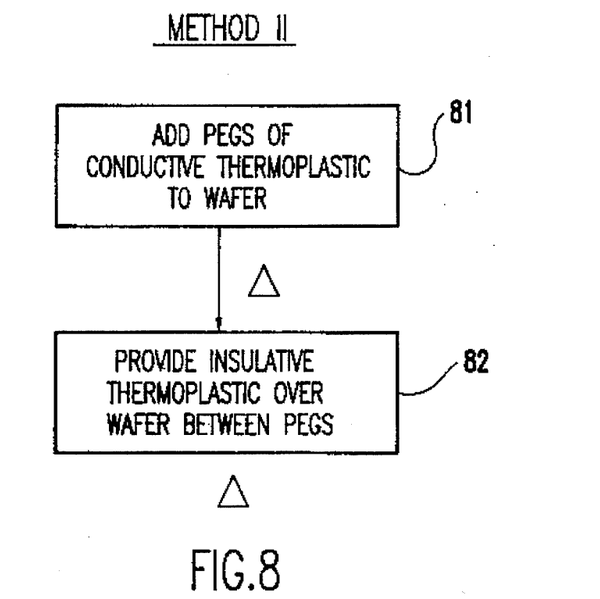
FIG. 8 is a flow diagram showing the process steps of the second method.

FIG. 8 shows a flow diagram of the second method. The first step 81 is to add pegs of conductive thermoplastic adhesive to chip pad sites on the wafer. Then, in step 82, the insulative layer of adhesive is provided around the pegs.

Figure 9:
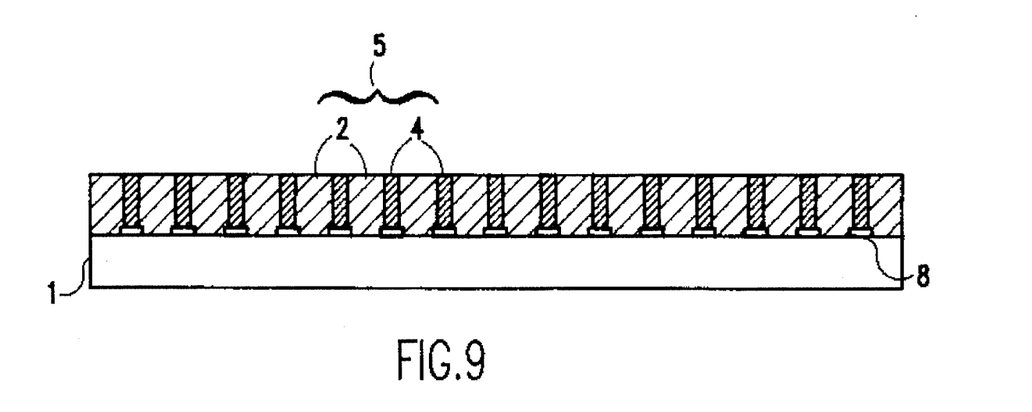
FIG. 9 is a cross-sectional view of a finished substrate with insulative and conducting thermoplastic.
Figure 10:
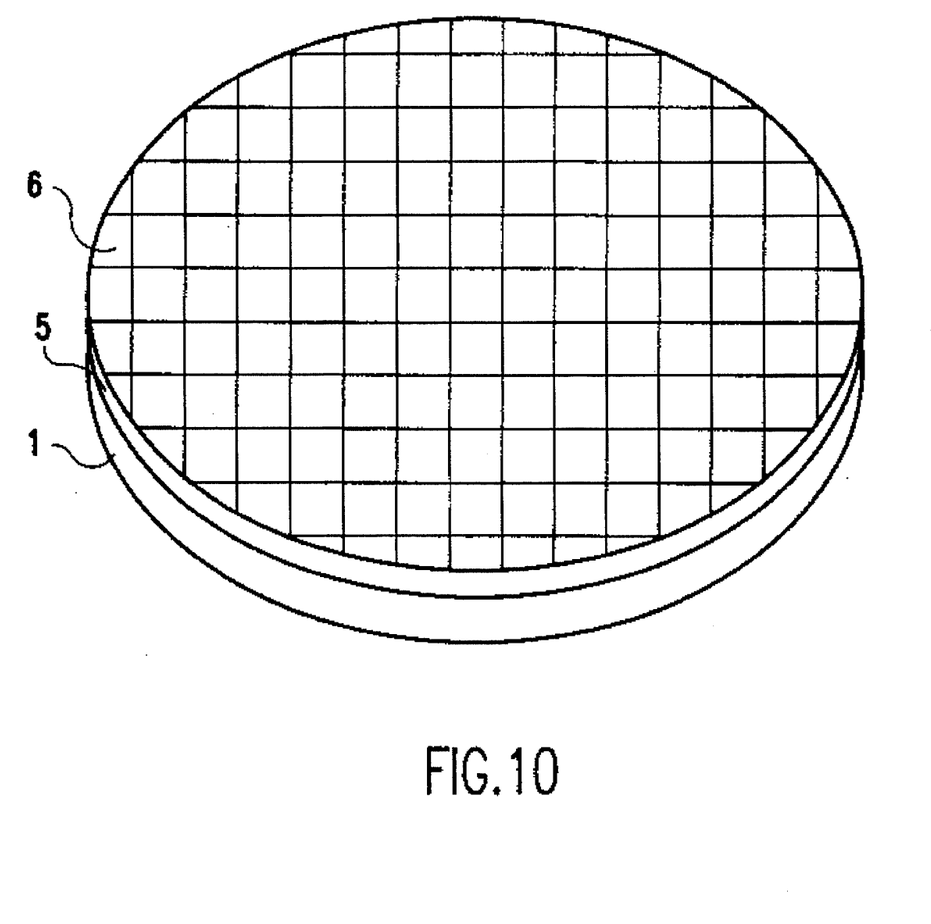
FIG. 10 is a wafer with a thermoplastic layer ready for sawing or dicing into chips.

FIG. 9 is a cross-sectional view of the final product, whether produced by the first or second methods. As can be seen in this view, the conductive adhesive 4 is surrounded by the insulative adhesive 2, and the composite adhesive structure 5 covers the entire surface of the substrate. At this stage, the conductive adhesive may project up above the level of the surrounding insulative adhesive and the holes may have a larger diameter than the bumps or pegs of conductive adhesive, but the volume of the conductive adhesive should be about the same as the holes, so that upon attachment, the two adhesives completely fill the space between the chip and substrate. FIG. 10 illustrates a wafer 1, with a composite thermoplastic layer 5 ready to be sawn or diced into chips 6. The thickness of the thermoplastic adhesives must be sufficient to compensate for any bowing of the substrates (such as an FR-4 circuit board), and metal pad height tolerances, and to form a good void free bond. Preferably, the thickness is 1–5 mils for ceramic and flexible substrates and 3–8 mil to attach chips to organic substrates, such as FR-4.

As can be understood from the foregoing, chips in the wafer are formed with an electrically conductive adhesive in a two pass screen process to apply adhesive to the pad side of the wafer. The order of the steps is not controlling. The first pass applies either the insulative or conductive adhesive to the chip bond pads. The second screening would apply the same or similar adhesive paste with a conductive or insulative filler to the same substrate surface. The addition of insulative filler to the insulative adhesive is optional depending on coefficient of thermal expansion (CTE) requirements. After each screening, solvent would be driven off in a bake or vacuum/bake step. The completed wafer is then ready for dicing.

The insulative thermoplastic adhesive is a dry fully polymerized dielectric adhesive preferably selected from one of the following polymer systems and may be filled with dielectric solids preferably ceramic particles, quartz, or glass. Preferred dielectric polymer systems include thermoplastic polymers, copolymers, or blends. Examples of polymers include, but are not limited to, nylons, polysulfones, polyesters, flexible and soluble polyimides and siloxanes. Copolymers include, but are not limited to, random, segmented or block copolymers made of ethylene and vinyl acetate (EVA), siloxane and aryl-ethers, polyurethanes composed of polyisocyanate and polyethers or polyester segments. Blends may be of two or more polymers/copolymers such as ethylene-acrylate copolymer with polyethylene, EVA and poly(vinyl chloride) (PVC), polyester and PVC. Conductive thermoplastic systems are composed of fully polymerized thermoplastic systems such as the above and electrically conductive particles made of or coated by Au, Ag, Pd or their oxide free, noble alloys. In order to form a paste for application the fully polymerized thermoplastic system and fillers are thinned with a solvent or mixed a liquid to form an emulsion. After application the material is heated at an elevated temperature to evaporate the solvent or liquid until dry (non-tacky). In order to bond the chip to the substrate the adhesive must be heated significantly above the transition temperature until it becomes tacky. The insulating and conductive adhesive materials are preferably selected to be compatible during attachment processing. The thermoplastic materials must be chemically compatible so they do not negatively affect each others properties and preferably so that they bond together tightly for strength. Also, preferably the properties of the thermoplastics are similar to provide about the same CTE to minimize stresses and provide overlapping preferred drying and bonding temperature ranges.

Figure 11:
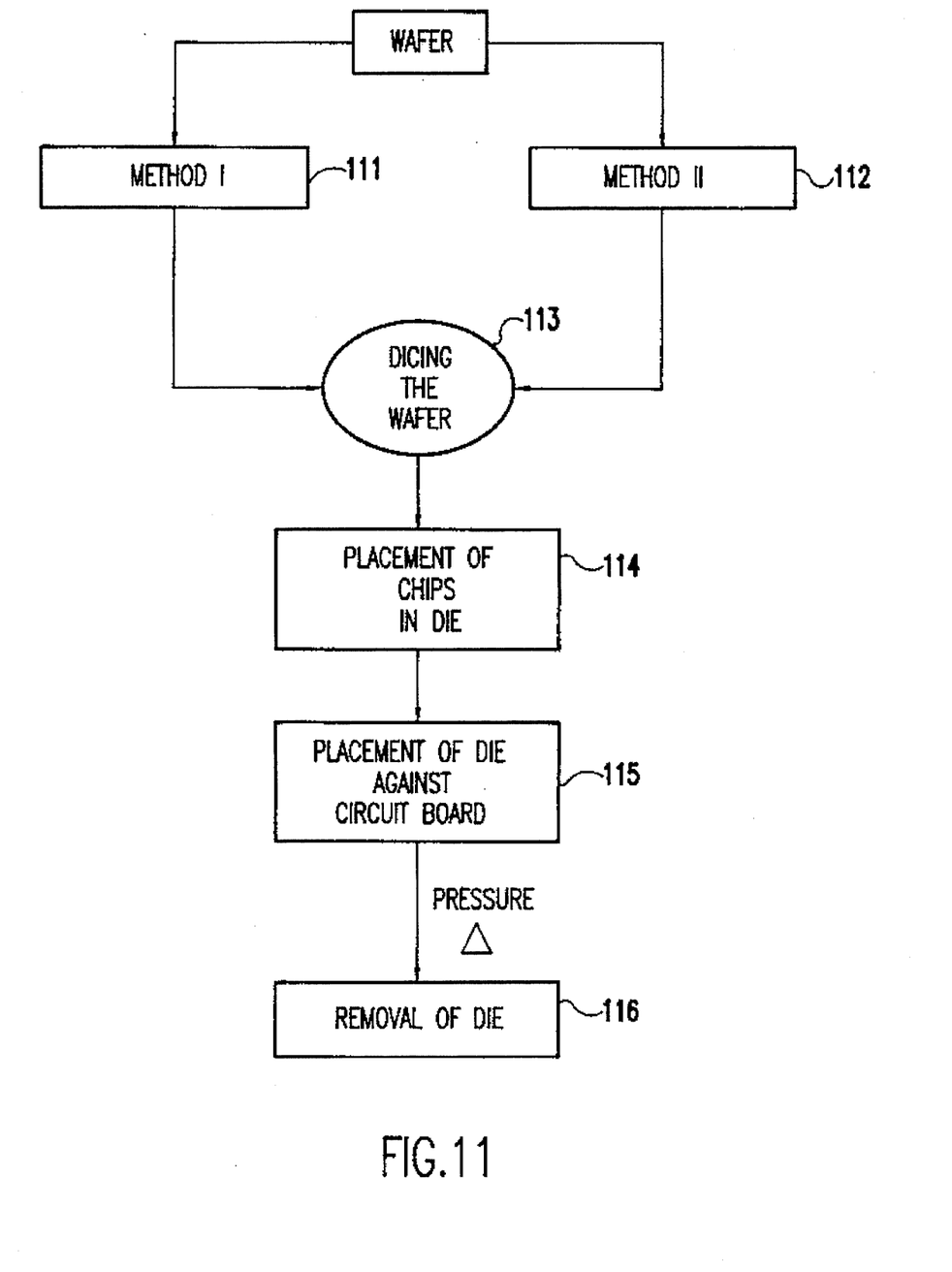
FIG. 11 is a flow diagram showing the process of creating chips by either of the two methods and adding them to a chip carrier.

FIG. 11 is a flow diagram illustrating preparing a chip to be placed on a chip carrier, starting with a wafer. As can be seen in the diagram, the wafer can be prepared by either method, here indicated as Method I and denoted by reference numeral 111, where insulative thermoplastic adhesive paste is added to the wafer, dried (unless added as a pre-punched dry film adhesive bonded directly to the wafer surface), and then conductive thermoplastic adhesive paste is added to holes made in the insulative adhesive, or Method II and denoted by reference numeral 112, where conductive pegs of adhesive paste are added to the wafer, dried, then the insulative thermoplastic paste is applied to fill gaps between the conductive thermoplastic pegs. Following either Method I or Method II, the wafer is diced into chips in step 113. The chips are placed in a die in step 114, and the die is pressed against a chip carrier and heat is added in step 115. When the die is removed in step 116, the chip remains adhered to the chip carrier. An optional step in this process is to add conductive thermoplastic adhesive to the pads on the chip carrier and drying the optional adhesive before pressing the die and chips against the chip carrier.

Alternative manufacturing methods not illustrated include, applying the insulative adhesive to the chip carrier and the conductive adhesive bumps to the chip. After fitting the matching pieces together, heat and pressure are applied as in other methods. Also, both the insulative and conductive adhesives may be applied to the chip carrier by Methods I and II, using heat and pressure to attach the chip to the prepared chip carrier. Furthermore, the insulative and conductive adhesives may be applied to the chip carrier and in addition, conductive adhesive may be applied to the metal contact pads on the chip.

Figure 12:
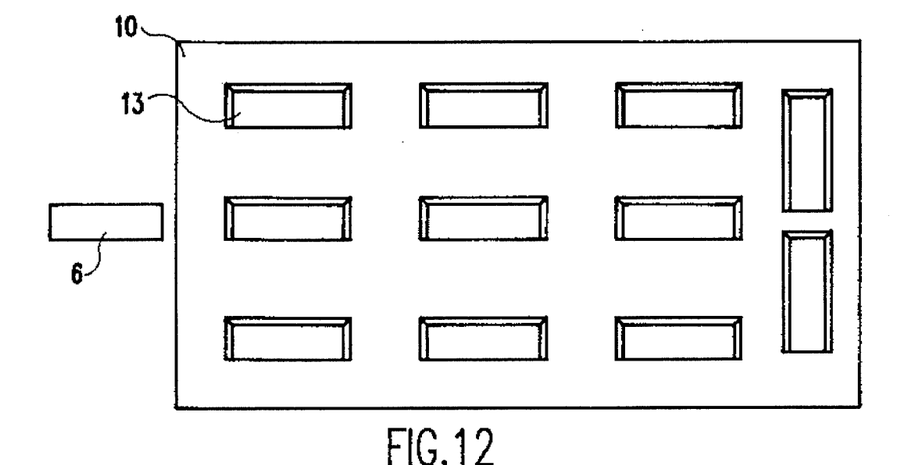
FIG. 12 is a plan view of a die for assembling chips on a chip carrier.
Figure 13:
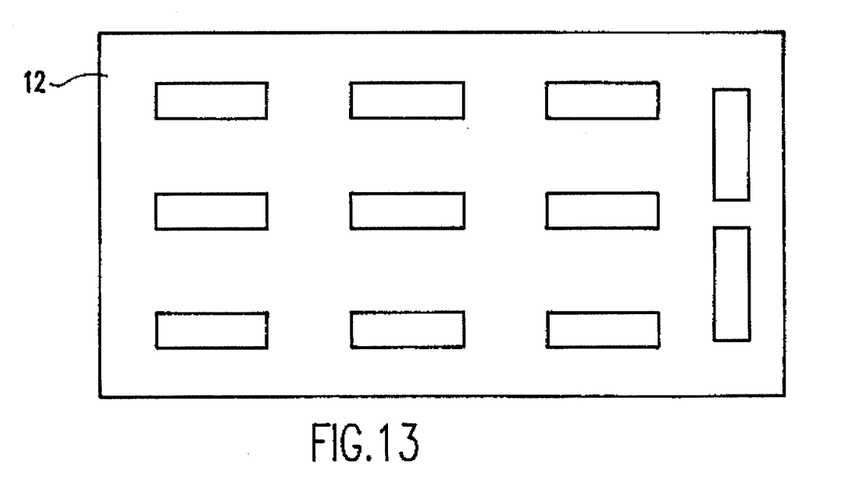
FIG. 13 is a plan view of a chip carrier.
Figure 14:
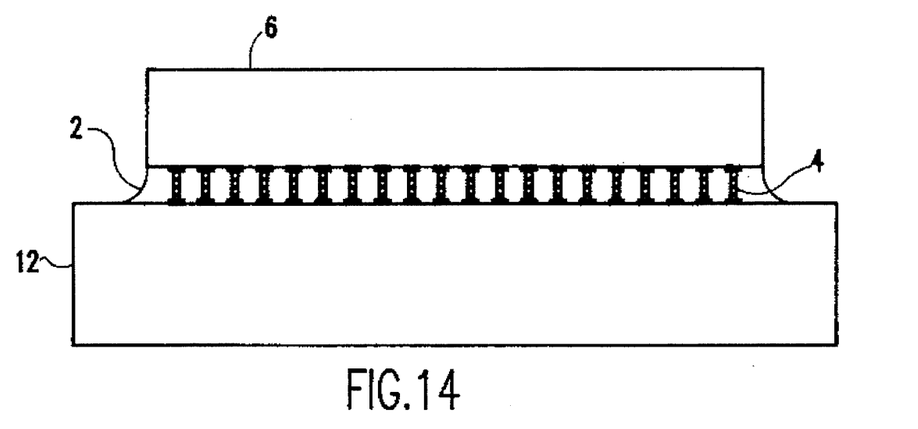
FIG. 14 is a cross-sectional view of a chip adhered to a chip carrier.

FIG. 12 illustrates a die 10 which may be used to add chips to a chip carrier 12, illustrated in FIG. 13. Chip carrier 12 will have conductive pads to match the bumps of conductive adhesive 4 in the chip 6 to be adhered to the chip carrier. The chips 6 are placed in recesses 13 on the die. The die 10 is then pressed against the chip carrier 12 and heat is added. When the die is removed, the chips remain adhered to the chip carrier. FIG. 14 shows a single chip adhered to the printed chip carrier after assembly. Here, a chip 14 is adhered to a chip carrier 12 with a layer of insulative thermoplastic adhesive 2 filling gaps between conductive thermoplastic adhesive 4 bumps. The electrically insulating thermoplastic adhesive completely fills the volume between the chip and the chip attach site around the electrically conductive adhesive pegs which adhesively connect between confronting pairs of metal contact pads.

Figure 15:
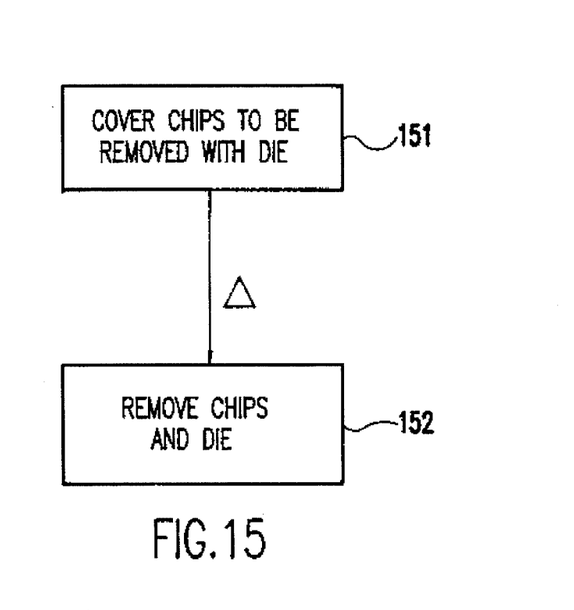
FIG. 15 is a flow diagram of reworking a chip and chip carrier.

This process simplifies mass production of chips mounted to carriers by removing the need for solder and makes it possible to replace chips since the thermoplastic adhesive is reworkable. Reworking is illustrated in the flow chart depicted in FIG. 15. Because this is a thermoplastic adhesive, reworking is relatively simple and inexpensive. To replace a single chip in a chip carrier, a die to fit the single chip is placed over the chip in step 151. The die is heated and then removed, taking the chip with it in step 152. Any remaining adhesive may require removal using known solvents depending on the adhesive system. A new chip is then placed in a single chip die, pressed against the board with heat, and adhered to the board, much the same as in the original assembly of the printed chip carrier. This is a particularly useful feature of this invention which is not found in other methods of chip to carrier assembly. In other chip attachment technologies, if a single chip of a chip carrier is bad, in most cases the whole must be replaced. In other cases, there is an involved process of filing thermosetting polymers remaining on the chip carrier after removing the bad chip. The process according to the invention makes chip replacement a simple and economically viable process.

A step which may be optional depending on chip size and planarity of the carrier surface would be to screen dispense electrically conductive adhesive onto the carrier pads as well and to dry this adhesive prior to connection (heat bonding).

In preparation for bonding chips to a chip carrier or circuit board, individual chips are heated to a temperature significantly above the transition temperature at which the thermoplastic adhesive is in a soft, tacky state. The surface of the carrier chip site is heated similarly. A typical temperature would be 150° to 300° C. An automatic chip placement tool would be used to pick the chip and place the chip on the chip site of the carrier. Placement and bonding is accomplished in one step. Bonding occurs with time at temperature and pressure. The placement tool can be set to apply the required bonding load (e.g.>30 psi) for the necessary time (e.g. several seconds). The electrical pads of the chip and carrier are interconnected with the electrically conductive adhesive. The insulative thermoplastic adhesive mechanically joins the chip to the carrier surface.

While the invention has been described in terms of two preferred embodiments, those skilled in the art will recognize that the invention can be practiced with modification within the spirit and scope of the appended claims.

Having thus described our invention, what we claim as new and desire to secure by Letters Patent is as follows:

1. An integrated circuit chip with a matrix of conductive interconnections for direct chip attachment, said matrix comprising:

a matrix of thin, electrically conductive metal pads on a major surface of the chip;

a layer of dry thermoplastic adhesive forming a chip attachment surface, said layer including:

bumps of electrically conductive adhesive deposited on each of the metal pads; and an electrically insulating adhesive filling around the conductive bumps and covering the major surface of the chip betw said een the bumps and extending from the major surface of the chip to said surface for attachment to form a unitary structure around the bumps.

2. An integrated circuit chip as recited in claim 1 wherein said insulating adhesive contains a dielectric thermoplastic and a solid insulating filler to control a coefficient of thermal expansion of the adhesive.

3. An integrated circuit chip as recited in claim 2 wherein said insulating filler is selected from the group consisting of glass particles and ceramic particles.

4. An integrated circuit chip as recited in claim 1 wherein said conductive adhesive includes a thermoplastic modified by adding a conductive filler.

5. An integrated circuit chip as recited in claim 4 wherein said conductive filler includes conductive particles comprising a conductive material selected from the group consisting of Au, Ag, Pd, and oxide free noble alloys thereof.

6. An integrated circuit chip as recited in claim 1 wherein said conductive adhesive and said insulating adhesive are selected to have similar properties and chemical compatibility.

7. An integrated circuit chip as recited in claim 1 wherein said insulating adhesive includes a polymer.

8. An integrated circuit chip as recited in claim 1 wherein said insulating adhesive includes a polymer selected from the group consisting of nylons, polysulfones, polyesters, polyimides, and siloxanes.

9. An integrated circuit chip as recited in claim 1 wherein said insulating adhesive includes a copolymer, said copolymer being selected from the group consisting of random copolymers, segmented copolymers, and block copolymers.

10. An integrated circuit chip as recited in claim 1 wherein said insulating adhesive includes a blend of at least two different polymeric materials.

11. An integrated circuit chip as recited in claim 1 wherein the chip surface includes a thin passivation layer of polyimide.

12. An integrated circuit chip as recited in claim 1 wherein said insulating adhesive includes a copolymer, said copolymer being selected from the group consisting of an ethylene/vinyl acetate copolymer, a siloxane/aryl-ether copolymer, and a polyurethane copolymer.

13. An integrated circuit chip as recited in claim 1 wherein said insulating adhesive includes a blend of at least two different polymeric materials, said blend selected from the group consisting of a blend of ethylene-acetate copolymer with polyethylene, a blend of ethylene and vinyl acetate and polyvinyl chloride, and a blend of polyester and polyvinyl chloride.

14. An integrated circuit chip as recited in claim 1 wherein said conductive adhesive includes a polymer.

15. An integrated circuit chip as recited in claim 1 wherein said conductive adhesive includes a polymer selected from the group consisting of nylons, polysulfones, polyesters, polyimides, and siloxanes.

16. An integrated circuit chip as recited in claim 1 wherein said conductive adhesive includes a copolymer, said copolymer being selected from the group consisting of random copolymers, segmented copolymers, and block copolymers.

17. An integrated circuit chip as recited in claim 1 wherein said conductive adhesive includes a blend of at least two different polymeric materials.

18. An integrated circuit chip as recited in claim 1 wherein said conductive adhesive includes a copolymer, said copolymer being selected from the group consisting of an ethylene/vinyl acetate copolymer, a siloxane/aryl-ether copolymer, and a polyurethane copolymer.

19. An integrated circuit chip as recited in claim 1 wherein said conductive adhesive includes a blend of at least two different polymeric materials, said blend selected from the group consisting of a blend of ethylene-acetate copolymer with polyethylene, a blend of ethylene and vinyl acetate and polyvinyl chloride, and a blend of polyester and polyvinyl chloride.

20. An interconnection substrate with a matrix of conductive interconnects for direct attachment to a mirror image matrix of conductive metal contacts on a major surface of another substrate, said interconnection substrate comprising:

a matrix of thin, electrically conductive, metal pads on a major surface of the interconnection substrate; and a dry composite single layer of polymerized thermoplastic adhesive forming a surface for attachment to said mirror image matrix of conductive metal pads and said major surface of said another substrate, including:

a deposit of electrically conductive adhesive on each of the metal pads for bonding to a metal pad and to a metal contact to form a reliable electrical interconnection, and electrically insulating adhesive around the conductive deposit sufficiently thick for filling the volume between the substrates and around the deposit after bonding the insulating adhesive to the major surface of said another substrate.

21. An interconnect structure, comprising;

a substrate with at least one matrix of thin, electrically conductive, metal interconnect pads on a major surface;

at least one integrated circuit chip with a matrix of thin, electrically conductive, metal interconnect pads on a major surface and in which the chip matrix is a mirror image of the substrate matrix and confronts the substrate matrix to define confronting pairs of metal pads;

a single layer of dry electrically conductive, thermoplastic adhesive connecting between each respective confronting pair of metal pads and bonded directly to both such pair of metal pads to form electrical interconnections; and a single layer of dry electrically insulating, void free, thermoplastic adhesive which is bonded directly to both the surface of the substrate and surface of the chip and extending around the electrically conductive adhesive to fill a volume between the chip and substrate to encapsulate the electrical interconnections.

\* \* \* \* \*